United States Patent [19]

Kondo et al.

[11] Patent Number: 4,883,571

[45] Date of Patent: Nov. 28, 1989

[54] PROCESS FOR PREPARING A PRINTED-CIRCUIT BOARD

[75] Inventors: Toshio Kondo; Yoshimasa Kinaga, both of Hiratsuka, Japan

[73] Assignee: Kansai Paint Co., Ltd., Amagasaki, Japan

[21] Appl. No.: 147,894

[22] Filed: Jan. 25, 1988

[30] Foreign Application Priority Data

Jan. 26, 1987 [JP] Japan .................................. 62-15602

[51] Int. Cl.[4] ......................... H05K 3/06; C25D 15/00
[52] U.S. Cl. .............................. 204/180.6; 156/659.1; 156/901; 204/181.6; 430/318; 430/394; 430/396
[58] Field of Search ................ 430/311, 314, 313, 318, 430/394, 494, 396; 204/180.6, 181.6, 181.7; 156/656, 659.1, 901

[56] References Cited

U.S. PATENT DOCUMENTS

| | | | |
|---|---|---|---|
| 3,905,818 | 9/1975 | Margrain | 430/314 X |
| 4,455,369 | 6/1984 | Purro | 430/357 |
| 4,592,816 | 6/1986 | Emmons et al. | 204/180.6 |
| 4,696,889 | 9/1987 | Yevick | 430/311 |

Primary Examiner—John F. Niebling
Assistant Examiner—William T. Leader
Attorney, Agent, or Firm—Fisher, Christen & Sabol

[57] ABSTRACT

Disclosed is a process for preparing a printed-circuit board, which process comprises the steps of:
(a) subjecting a copper plated laminated, insulative plate for use in a printed circuit and having through-holes to electrodeposition coating in a photo-curable electrodeposition coating composition bath to form a resist film on the surface of a copper foil of the copper plated laminated insulative plate;
(b) lapping a wiring pattern mask on the resist film so that a through-hole wall area may form an exposed area;
(c) exposing the resist film to ultraviolet light through the lapped wiring pattern mask;
(d) removing the wiring pattern mask from the resist film;
(e) exposing the resist film in the through-hole wall area to ultraviolet light through an optical fiber;
(f) removing the resist film not exposed under the wiring pattern mask;
(g) etching away the exposed copper foil; and
(h) removing the etching resist pattern film.

8 Claims, 1 Drawing Sheet

PROCESS FOR PREPARING A PRINTED-CIRCUIT BOARD

BACKGROUND OF THE INVENTION (1) Field of the Invention:

This invention relates to a process for preparing a printed-circuit board, and more particularly to a process for preparing a printed-circuit board having through-holes therein.

(2) Description of the Prior Art:

Recently, an improved process for preparing a printed-circuit board has been developed, which process comprises subjecting a copper plated laminated, insulative plate (hereinafter may be referred to as a "plate") for use in a printed circuit and having through holes such as through-holes to electrodeposition coating in a photocurable electrodeposition coating composition bath to form a resist film on the plate, exposing the resist film to an active light through a wiring pattern mask, removing a non-exposed area of the resist film with an alkaline water or the like, etching away the exposed copper foil to form an etching resist pattern film on the plate, and removing the etching resist pattern film to prepare a desired printed circuit.

However, the aforementioned process has such a drawback that on exposing the resist film coated on the plate to the active light, an area of the resist film, in which the resist film on the plate forms a vertical surface to the active light, is exposed to the active light to form an etching resist pattern film having excellent film properties, whereas through-hole wall areas, in which the resist film forms a parallel surface to the active light, is not exposed to the active light because the active light passes through along the upper surface of the resist film, the non-exposed area is washed away with an alkaline water or the like and the copper foil, which is required for the printed circuit, is further removed by the etching treatment in the following step, resulting in making it impossible to form a conductive through-hole. Further, the aforementioned process has another drawback in that irradiation of the active light in such a dose as to be necessary for photocuring of the resist film in the abovementioned through-hole wall area results in irradiation of the active light in an excessive dose onto the resist film forming a vertical surface to the active light, in making it difficult to remove the film, and in making it impossible to form a conductive printed-circuit.

SUMMARY OF THE INVENTION

An object of this invention is to provide a process for preparing a printed-circuit board with a highly conductive printed-circuit including highly conductive through-holes by exposing the resist film in the through-hole wall area to the active light through an optical fiber.

That is, the present invention provides a process for preparing a printed-circuit board, which process comprises the steps of:

(a) subjecting a copper plated laminated, insulative plate for use in a printed circuit and having through-holes to electrodeposition coating in a photo-curable electrodeposition coating composition bath to form a resist film on the surface of a copper foil of the copper plated laminated insulative plate;

(b) lapping a wiring pattern mask on the resist film so that a through-hole wall area may form an exposed area;

(c) exposing the resist film to ultraviolet light through the lapped wiring pattern mask;

(d) removing the wiring pattern mask from the resist film;

(e) exposing the resist film in the through-hole wall area to ultraviolet light through an optical fiber;

(f) removing the resist film not exposed under the wiring pattern mask;

(g) etching away the exposed copper foil to form an etching resist pattern film on the plate; and (h) removing the etching resist pattern film.

BRIEF DESCRIPTION OF THE DRAWINGS

In FIGS. 1 and 2, the FIG. 1 is an optical fiber, the FIG. 2 is an ultraviolet light, the FIG. 3 is a resist film, the figure 4 is a copper foil, the FIG. 5 is a laminated plate, and the FIG. 6 is a through-hole.

DETAILED DESCRIPTION OF THE INVENTION

Figure 1:
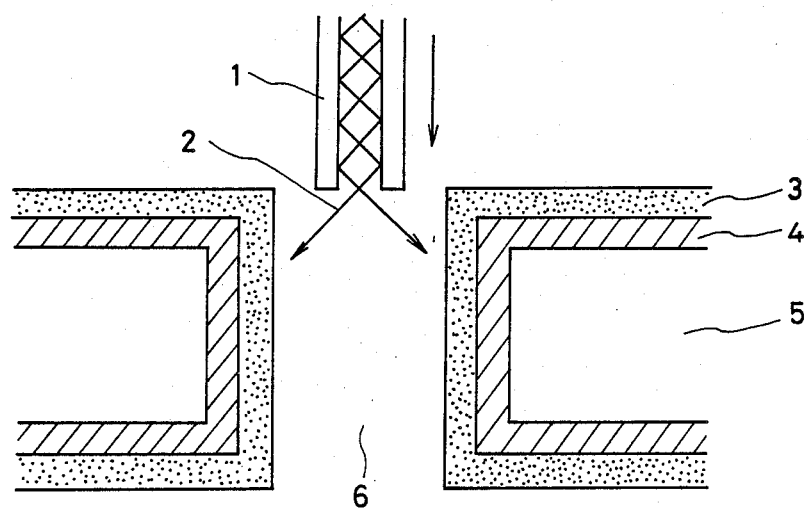
FIGS. 1 and 2 are a sectional view for illustrating a preferred embodiment of the step (e) of exposing the resist film in the through-hole wall area to ultraviolet light through an optical fiber according to the process of the present invention respectively.

The aforementioned steps of the process of the present invention are explained more in detail in the following respectively.

In the step (a) of the process of the present invention, a copper plated laminated, insulative plate for use in a printed circuit and having through-holes is applied to electrodeposition coating in a photo-curable electrodeposition coating composition bath to form a resist film on the surface of a copper foil of the copper plated laminated insulative plate.

The copper plated laminated, insulative plate for use in a printed circuit and having through-holes may be a conventional plate having through-holes, and particularly and advantageously is one having through-holes of 0.1 mm to 2 mm in diameter and 0.1 mm to 10 mm in height.

The photo-curable electrodeposition coating composition may be the conventional anionic or cationic electrodeposition coating composition, preferably the anionic electrodeposition coating composition from such standpoints as to make it easier to remove the resist film not exposed by use of an alkaline water in the step (f) and to improve adhesion properties by forming a chelate bond between carboxyl group in the anionic electrodeposition coating composition and copper. Electrodeposition coating may be carried out according to the conventional process by use of the abovementioned electrodeposition coating composition.

In the step (b) of the process of the present invention, the wiring pattern mask is lapped on the resist film so that the through-hole wall area may form an exposed area according to the conventional process.

In the step (c) of the process of the present invention, the resist film may be exposed to ultraviolet light through the lapped wiring pattern mask according to the conventional process. The resist film is generally exposed to ultraviolet light through the lapped circuit pattern mask, i.e. in the vertical direction thereto by use of an exposure apparatus. The exposure apparatus may be those conventionally used for ultraviolet light curing and includes, for example, an ultra-high pressure mercury-vapor lamp, a high pressure mercury-vapor lamp, and the like. The resist film may be photo-cured by irradiating ultraviolet light in an irradiation dose of 10 mj/cm$^2$ to 1000 mj/cm$^2$, preferably 50 mj/cm$^2$ to 200 mj/cm$^2$ by use of the exposure apparatus. When the irradiation dose is less than 10 mj/cm$^2$, photo-curing is insufficient. When the irradiation dose is greater than 1000 mj/cm$^2$, removal of the resist film becomes difficult.

In the step (d) of the process of the present invention, the wiring pattern mask is removed from the resist film according to the conventional process.

In the step (e) of the process of the present invention, the resist film in the through-hole wall area is exposed to ultraviolet light through the optical fiber, that is, an active light emitted from the emitter of the optical fiber is irradiated onto the resist film in the through-hole wall area to be photo-cured. The optical fiber makes it possible to introduce the active light into the through-hole so that the active light may be irradiated onto the resist film in the through-hole wall area to be photo-cured, and preferably has a shape capable of passing through the through-hole and, for example, has a diameter less than that of the through-hole. The active light is the same as used in the step (c), i.e. an ultraviolet light.

The resist film in the through-hole wall area may be photo-cured by irradiating the ultraviolet light in the same dose as in the step (c), i.e. an irradiation dose of 10 mj/cm$^2$ to 1000 mj/cm$^2$, preferably 50 mj/cm$^2$ to 200 mj/cm$^2$. When the irradiation dose is less than 10 mj/cm$^2$, curing of the resist film in the through-hole wall area is insufficient, resulting in that the resist film therein is removed in the step (f), that the exposed copper therein is removed by the etching treatment in the step (g), and in that conductivity of the through-hole wall area becomes poor. When the irradiation dose is greater than 1000 mj/cm$^2$, removal of the resist film becomes difficult because of excessive curing.

Figure 2:
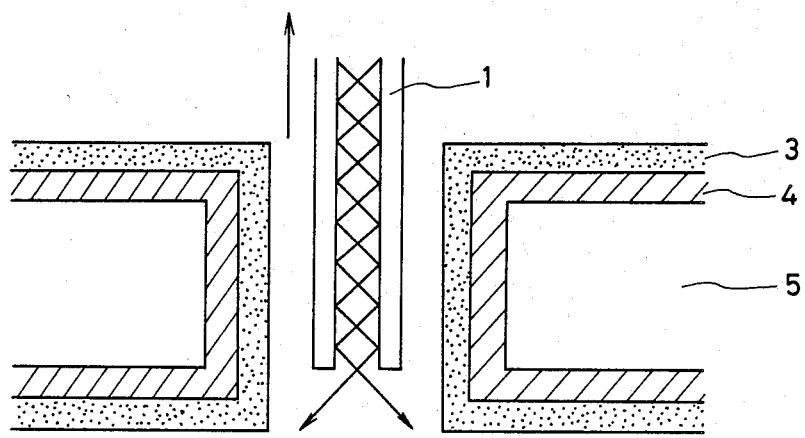

A preferable embodiment of the step (e) of exposing the resist film in the through-hole wall area to ultraviolet light through the optical fiber is explained more in detail with reference to the drawings, i.e. FIGS. 1 and 2.

An optical fiber is set so that an emitter tip of an optical fiber 1 may be positioned over a through-hole 6 of a plate prepared by forming a resist film 3 on a copper foil 4 of a copper plated laminated, insulative plate 5 for use in a printed circuit by electrodeposition coating as shown in FIG. 1.

Ultraviolet light is then introduced into the optical fiber 1 and ultraviolet light 2 emitted from the optical fiber 1 is irradiated onto the resist film in the through-hole wall area as the optical fiber 1 moves downward through the through-hole 6 to a position shown in FIG. 2 so that the whole area of the through-hole wall area may be irradiated uniformly. Thereafter the resist film in the through-hole wall area is further photo-cured as the optical fiber 1 shown in FIG. 2 moves upward, i.e. reversely through the through-hole 6.

In the step (e) of exposing the resist film in the through-hole wall area to ultraviolet light through the optical fiber, any other processes capable of photo-curing the resist film in the through-hole wall area by use of the active light emitted from the optical fiber, may be used, including, for example, a process in which the active light emitted from the emitter of the optical fiber is irradiated onto the resist film in the through-hole wall area from both sides facing to each other, a process in which a reflector is mounted at the emitter tip of the optical fiber so that a scattered active light may be irradiated onto the resist film in the through-hole wall area, and so forth.

The steps of (f) removing the resist film not exposed under the wiring pattern mask, (g) etching away the exposed copper foil to form an etching resist pattern film on the plate, and (h) removing the etching resist pattern film, may be carried out according to the conventional process respectively.

The present invention makes it possible to provide an improved process for preparing a highly conductive printed-circuit board having through-holes in that the active light is irradiated onto the resist film in the through-hole wall area in substantially the same irradiation dose as in the case where the resist film is exposed to the active light through the lapped wiring pattern mask, resulting in solving the aforementioned problems in the prior art.

The present invention is explained more in detail by the following Example and Comparative Example.

EXAMPLE 1

A copper plated laminated, insulative plate for use in a printed-circuit and having through-holes of 0.3 mm to 0.8 mm in inner diameter and 3 mm in height is dipped in an anionic electrodeposition coating composition (Sonne EDUV No. 338, marked by Kansai Paint Co., Ltd.) bath and is applied to electrodeposition coating by applying 100 V for 3 minutes to form a resist film having a thickness of about 13 μ on the surface of a copper foil of the copper plated laminated insulative plate followed by washing with water and drying at 70° C. for 2 minutes to obtain a dry resist film. A wiring pattern mask is lapped on the resulting resist film so that the through-hole wall area may form an exposed area, and ultraviolet light is irradiated in an irradiation dose of 50 mj/cm$^2$ thereonto by use of an ultra-high pressure mercury-vapor lamp. Next, the wiring pattern mask is removed from the resist film, and the resist film in the through-hole wall area is then photo-cured by irradiating ultraviolet light in an irradiation dose of 50 mj/cm$^2$ through an optical fiber. Thereafter, the resist film in the non-exposed area is removed by spraying a 1% aqueous sodium carbonate solution at 25° C. for 60 seconds followed by spraying an aqueous cupric chloride solution for 60 seconds to remove the exposed copper foil by etching treatment and to obtain a plate having an etching resist pattern film. Finally, the etching resist pattern film is removed by spraying a 3% aqueous caustic soda solution at 50° C. for 100 seconds to obtain an intended printed-circuit board having through-holes.

The printed-circuit board thus obtained is subjected to continuity test between the copper foil coated on the plane area of the plate and the through-hole wall area by use of a tester in order to show degree of peeling of the copper foil in the through-hole wall area with the result that none of the copper foils in respective through-hole wall areas among 3000 through-holes is peeled off.

COMPARATIVE EXAMPLE 1

Procedures of Example 1 are repeated except that the resist film in the through-hole wall area is not exposed to ultraviolet light through the optical fiber.

The printed-circuit board thus obtained is subjected to continuity test in the same manner as in Example 1 with the result that the copper foils in 2800 through-hole wall areas among 3000 through-holes are peeled off, showing that the copper foils in the through-hole wall areas are substantially peeled off and that conductivity therein becomes poor.

What is claimed is:

1. Improved process for preparing a printed-circuit board, which process comprises the steps of:
   (a) subjecting a copper-plated, laminated, insulative plate for use in a printed circuit and having through-holes to electrodesposition coating in a photo-curable electrodeposition coating composition bath to form a resist film on the surface of a copper foil of the copper-plated, laminated, insulative plate;
   (b) lapping a wiring pattern mask on the resist film so that a through-hole wall area can form an exposed area;
   (c) exposing the resist film to ultraviolet light through the lapped wiring pattern mask;
   (d) removing the wiring pattern mask to from the resist film;
   (e) removing the resist film not exposed under the wiring pattern mask to form an etching resist pattern film on the plate;
   (f) etching away the exposed copper foil; and
   (g) removing the etching resist pattern film, the improvement comprising, after the step of (d) removing the wiring pattern mask from the resist film, exposing the resist film in the through-hole wall area to ultraviolet light through an optical fiber having a shape capable of passing through the through-hole, the ultraviolet light emitted from an emitter of the optical fiber being irradiated onto the resist film in the though-hole wall area as the emitter of the optical fiber passes through the through-hole reciprocally throughout the through-hole.

2. The process as claimed in claim 1 wherein the ultraviolet light is emitted from respective emitters of two optical fibers facing each other.

3. The process as claimed in claim 1 or 2 wherein the photo-curable electrodeposition coating composition is an anionic electrodeposition coating composition.

4. The process as claimed in claim 1 or 2 wherein the resist film is exposed through the lapped wiring pattern mask by irradiating thereonto ultraviolet light in an irradiation dose of 10 mj/cm$^2$ to 1000 mj/cm$^2$.

5. The process as claimed in claim 4 wherein said ultraviolet light is irradiated in an irradiation dose of 50 mj/cm$^2$ to 200 mj/cm$^2$.

6. The process as claimed in claim 1 or 2 wherein the resist film in the through-hole wall area is exposed by irradiating thereonto ultraviolet light emitted from an emitter of the optical fiber in an irradiation dose of 10 mj/cm$^2$ to 1000 mj/cm$^2$.

7. The process as claimed in claim 6 wherein said ultraviolet light is irradiated in an irradiation dose of 50 mj/cm$^2$ to 200 mj/cm$^2$.

8. The process as claimed in claim 1 or 2 wherein said through-hole has a diameter of 0.1 mm to 2 mm and a height of 0.1 mm to 10 mm.

* * * * *